(12) United States Patent
Kang et al.

(10) Patent No.: US 7,592,864 B2
(45) Date of Patent: Sep. 22, 2009

(54) HIGH-ORDER LOW-PASS FILTER CIRCUIT AND METHOD

(75) Inventors: Sang Hoon Kang, Hwaseong-si (KR); Seung Chan Heo, Giheung-gu (KR); Ji Soo Jang, Yongin-si (KR); Hui Jung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/124,405

(22) Filed: May 21, 2008

(65) Prior Publication Data
US 2008/0303589 A1    Dec. 11, 2008

(30) Foreign Application Priority Data
Jun. 7, 2007    (KR) .................. 10-2007-0055413

(51) Int. Cl.
*H03K 5/00*    (2006.01)
(52) U.S. Cl. .................. 327/558; 327/552; 327/559
(58) Field of Classification Search .......... 327/551–559
See application file for complete search history.

(56) References Cited

U.S. PATENT DOCUMENTS

| | | | | |
|---|---|---|---|---|
| 3,702,405 A | * | 11/1972 | Zwirn et al. ................. | 307/109 |
| 4,078,205 A | * | 3/1978 | Van Schoiack .............. | 330/107 |
| 4,122,398 A | * | 10/1978 | Dunn ......................... | 330/107 |
| 4,509,019 A | | 4/1985 | Banu et al. | |
| 5,652,537 A | * | 7/1997 | Fleeman ..................... | 327/358 |
| 6,625,436 B1 | | 9/2003 | Tolson et al. | |

FOREIGN PATENT DOCUMENTS

| | | |
|---|---|---|
| JP | 62072216 | 4/1987 |
| JP | 03248615 | 11/1991 |
| KR | 19900001121 A | 1/1990 |
| KR | 1019930002996 B1 | 4/1993 |

* cited by examiner

*Primary Examiner*—Dinh T. Le
(74) *Attorney, Agent, or Firm*—Volentine & Whitt, PLLC

(57) ABSTRACT

A low-pass filtering circuit and method are disclosed. The circuit includes a low-pass filter with a capacitor, and a multiplier configured to multiply the capacitance of the capacitor by feeding-back a high-frequency signal apparent in an output signal of the low-pass filter to the capacitor.

7 Claims, 11 Drawing Sheets

HIGH-ORDER LOW-PASS FILTER CIRCUIT AND METHOD

CROSS-REFERENCE TO RELATED PATENT APPLICATION

This application claims the benefit of Korean Patent Application No. 10-2007-0055413 filed on Jun. 7, 2007, the disclosure of which is hereby incorporated by reference.

BACKGROUND OF THE INVENTION

1. Field of the Invention

The present invention relates to low-pass filtering technology, and more particularly, to a high-order low-pass filtering circuit and method characterized by reduced noise and physical size.

2. Description of the Related Art

Generally, wireless receivers (e.g., direct conversion receivers) or low intermediate frequency receivers use a low-pass filtering circuit to attenuate a blocker signal apparent in the output signal of a frequency conversion mixer. Figure (FIG.) 1A illustrates a conventional first-order low-pass filtering circuit. FIG. 1B is a graph illustrating the frequency pass characteristics for the first-order low-pass filtering circuit illustrated in FIG. 1A. Referring to FIG. 1A, the conventional first-order low-pass filtering circuit includes a resistor R1 and a capacitor C1. A cut-off frequency (fc) of the conventional first-order low-pass filtering circuit illustrated in FIG. 1A is may be expressed by Equation (1):

$$fc=1/(R1C1) \tag{1}$$

Thus, the cut-off frequency of the conventional first-order low-pass filtering circuit is determined by the resistance value of resistor R1 and the capacitance of capacitor C1. The resistance value of resistor R1 and the capacitance of capacitor C1 need to be very large in order to set the cut-off frequency fc to several hundreds of Hz.

However, in order to set the resistance value of resistor R1 and the capacitance of capacitor C1 to relatively large values, the layout area of resistor R1 and capacitor C1 must normally be increased using conventionally understood on-chip processes. However, there are practical limits to the amount by which the capacitance of capacitor C1 may be increased using on-chip processes. Thus, an external capacitor is often used to implement capacitor C1, but this approach typically requires that even more space be allocated to the low-pass filter.

In order to address this disadvantage, a low-pass filtering circuit including an amplifier 10, as illustrated in FIG. 2A, has been suggested. The low-pass filtering circuit including amplifier 10 decreases the cut-off frequency by feeding-back an output signal from amplifier 10 to capacitor C1. FIG. 2B is a graph illustrating the frequency pass characteristics of the low-pass filtering circuit illustrated in FIG. 2A.

Referring to FIGS. 2A and 2B, the cut-off frequency of the low-pass filtering circuit illustrated in FIG. 2A is lower than that of the first-order low-pass filtering circuit illustrated in FIG. 1A by an amount, "ΔF". However, the roll-off slope of the pass characteristics for the first-order low-pass filtering circuit illustrated in FIG. 1A is about the same as that of the low-pass filtering circuit illustrated in FIG. 2A. Accordingly, more ideal filtering results cannot be achieved. And while the roll-off slope characteristics may be improved by the use of a high-order low-pass filtering circuit, such circuits tend to increase noise.

SUMMARY OF THE INVENTION

Some embodiments of the present invention provide a high-order low-pass filtering circuit and method which does not increase noise or layout area.

In one embodiment, the invention provides a low-pass filtering circuit comprising; a low-pass filter comprising a capacitor, and a multiplier configured to multiply capacitance of the capacitor by feeding-back a high-frequency signal apparent in an output signal of the low-pass filter to the capacitor.

In another embodiment, the invention provides a low-pass filtering method comprising; filtering a low frequency using a capacitor, and multiplying capacitance of the capacitor by feeding-back a high-frequency signal apparent in the filtered signal to the capacitor.

DESCRIPTION OF EMBODIMENTS

The present invention now will be described with reference to the accompanying drawings. This invention may, however, be embodied in many different forms and should not be construed as being limited to only the illustrated embodiments. Rather, the embodiments are provided as teaching examples. Throughout the written description and drawings, like reference numbers and symbols refer to like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 3:
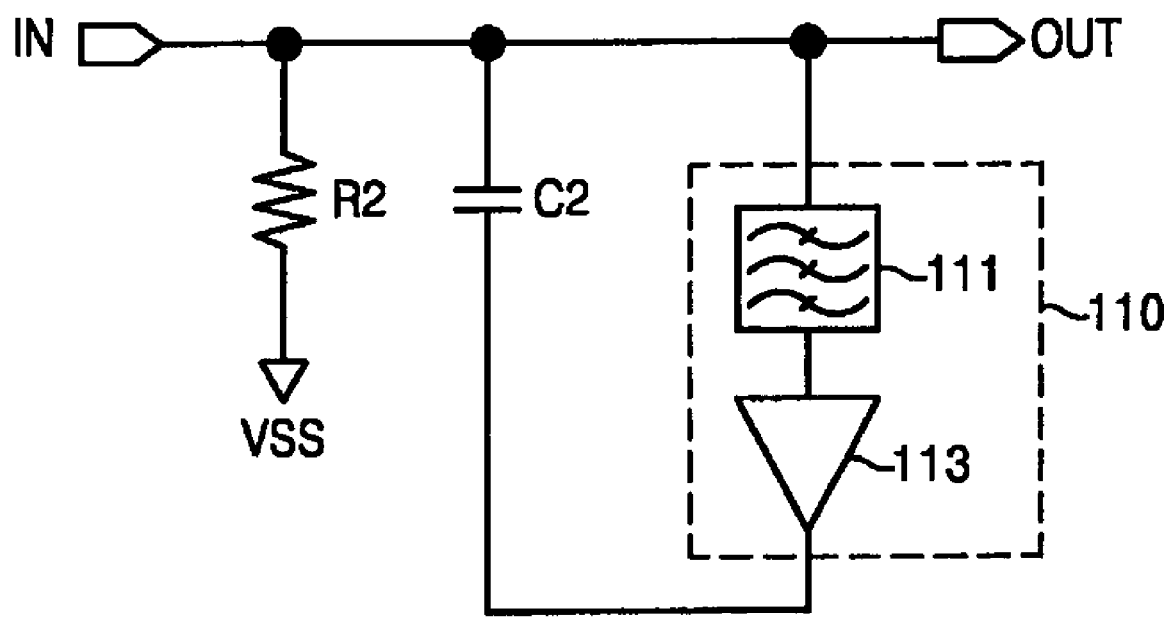
FIG. 3 illustrates a high-order low-pass filtering circuit according to an embodiment of the invention.

FIG. 3 illustrates a high-order low-pass filtering circuit according to an embodiment of the invention. Referring to FIG. 3, the high-order low-pass filtering circuit comprises a low-pass filter including a resistor R2 and a capacitor C2, and a capacitance multiplier 110. Capacitance multiplier 110 feeds-back a high-frequency signal apparent within the output signal of the low-pass filter to capacitor C2, thereby multiplying the capacitance of capacitor C2. The multiplication rate of the capacitance is larger at high frequencies than at low frequencies.

Figure 5A:
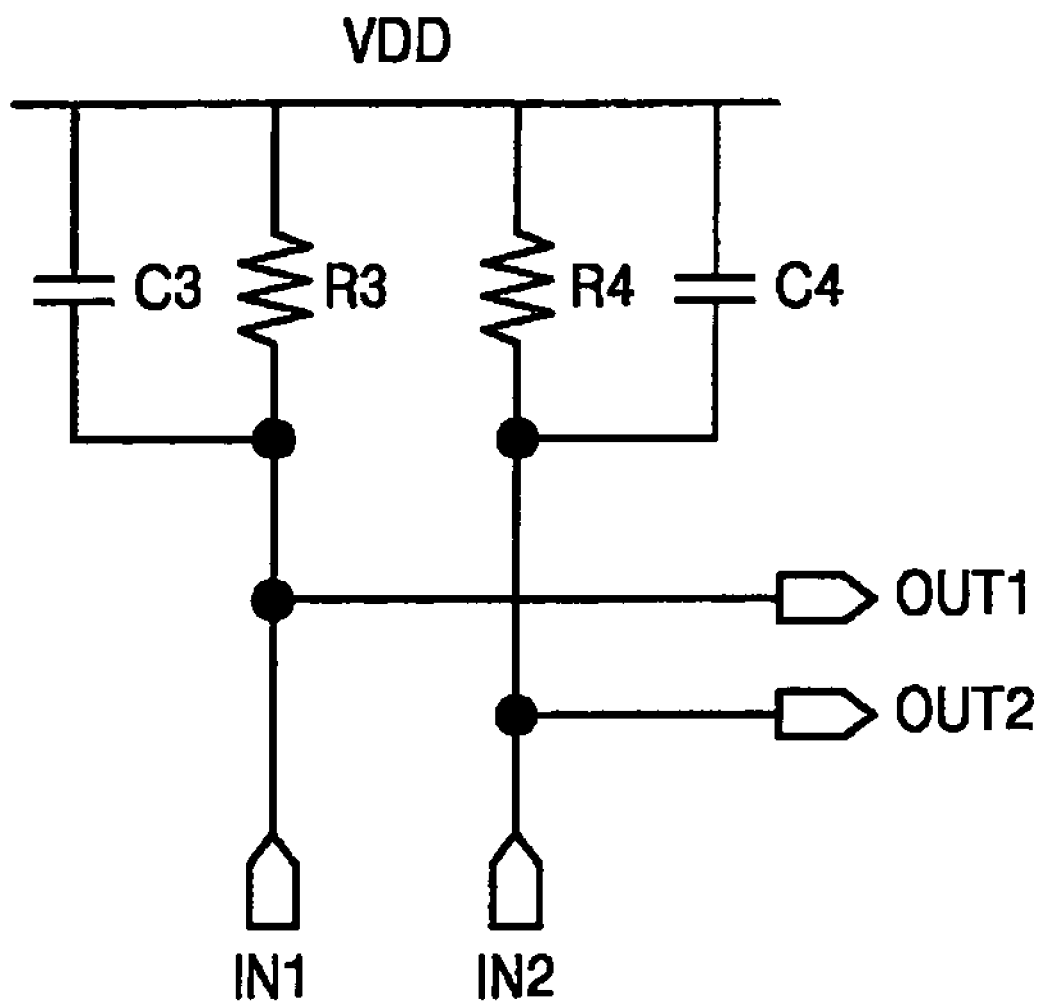
FIG. 5A illustrates a conventional load circuit having second-order low-pass characteristics.

The low-pass filter may be implemented using an inductor and a capacitor instead of resistor R2 and capacitor C2. The low-pass filter may operate in response to differential input signals. For instance, as illustrated in FIGS. 5A and 6B, a differential amplifier 215 or 315 may output differential output signals in response to differential input signals and a capacitance multiplier 210 or 310 may generate high-frequency feedback signals in response to the differential output signals of the differential amplifier 215 or 315 and output them to capacitors C3 and C4 or C9 and C10 in order to multiply the capacitance of the capacitors C3 and C4 or C9 and C10.

Figure 7:
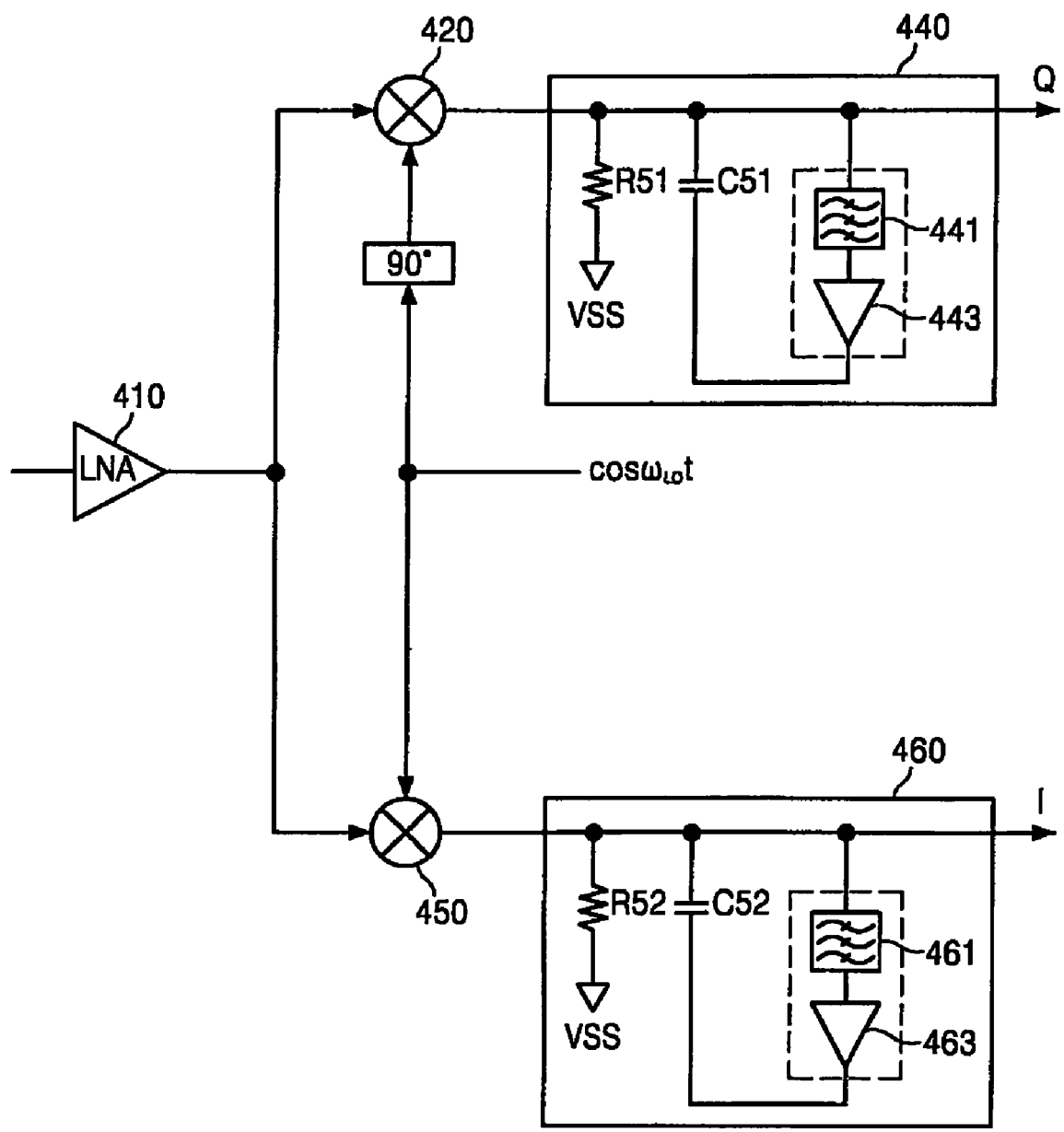
FIG. 7 is a circuit diagram of a direct conversion receiver including a low-pass filtering circuit according to an embodiment of the invention.

As illustrated in FIG. 7, a high-order low-pass filtering circuit 440 or 460 according to an embodiment of the invention may receive the output signal of a mixer 420 or 450 of a wireless receiver as an input signal in order to remove a blocker signal from the output signal of the mixer 420 or 450.

With reference to FIG. 3, the high-order low-pass filtering circuit further comprises an input terminal IN receiving an input signal, such as a current input, an output terminal OUT receiving an output signal, such as a voltage output, resistor R2 connected between the input terminal IN and ground VSS, capacitor C2 connected between the input terminal IN and an output terminal of capacitance multiplier 110, where capacitance multiplier 110 is connected to the output terminal OUT.

Capacitance multiplier 110 passes only a defined high-frequency signal apparent in the input signal to multiply the capacitance of capacitor C2. For this operation, capacitance multiplier 110 includes a high-passfilter 111 and a buffer 113. In one embodiment, high-pass filter 111 may be N-th order high-pass filter where "N" is a natural number. In other words, high-pass filter 111 passes only a high-frequency signal component from the input signal applied through the input terminal IN. Buffer 113 may be implemented by an amplifier and amplifies the high-frequency signal output from high-pass filter 111 and outputs an amplified signal to capacitor C2.

Since capacitance multiplier 110 is implemented using high-pass filter 111 and amplifier 113, its feedback gain is higher at high frequencies than at a low frequencies. This means that the resulting capacitance multiplication rate at higher frequencies is greater than that at lower frequencies. The high-order low-pass filtering circuit according to an embodiment of the invention has high-order low-pass filtering characteristics due to the difference between capacitance multiplication rates.

Since conventionally implemented high-order low-pass filters increase noise, a first-order low-pass manual filter is generally used. However, the high-order low-pass filtering circuit illustrated in FIG. 3 according to an embodiment of the invention does not increase noise and yet has the high-order low-pass filtering characteristics.

In other words, a low-pass filtering circuit including a multiplier, which includes a low-pass filter, i.e., first-order low-pass filter using a resistor-capacitor (RC) circuit and an Nth-order high-pass filter, has (N+1)-th low-pass filtering characteristics. In addition, when the low-pass filter illustrated in FIG. 3 uses an inductor-capacitor (LC) circuit, that is, the low-pass filter is a second-order low-pass filter, a low-pass filtering circuit according to certain embodiments of the invention has (N+2)-th order low-pass filtering characteristics.

Figure 1A:
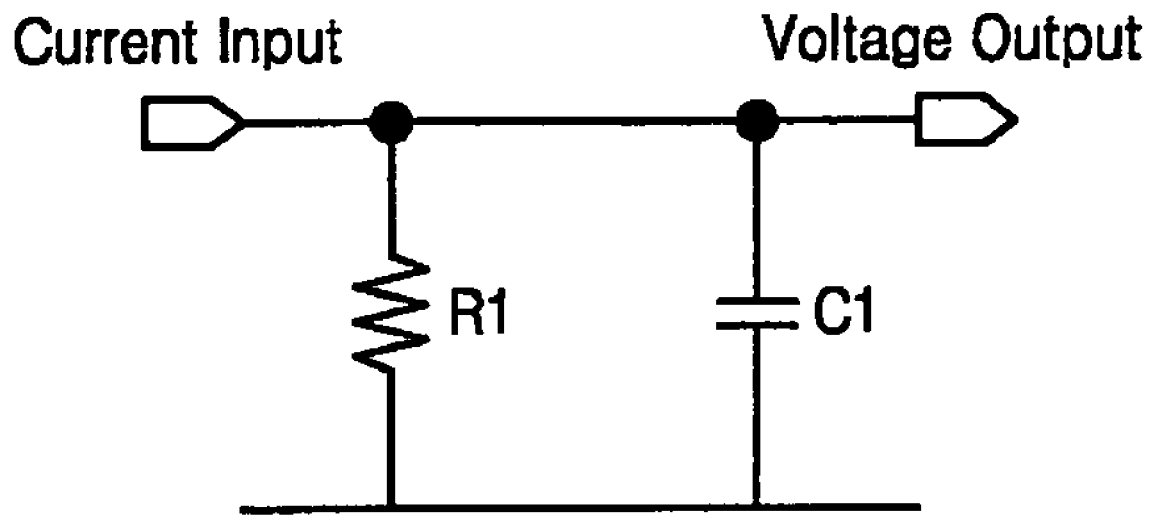
FIG. 1A illustrates a conventional first-order low-pass filtering circuit.
Figure 1B:
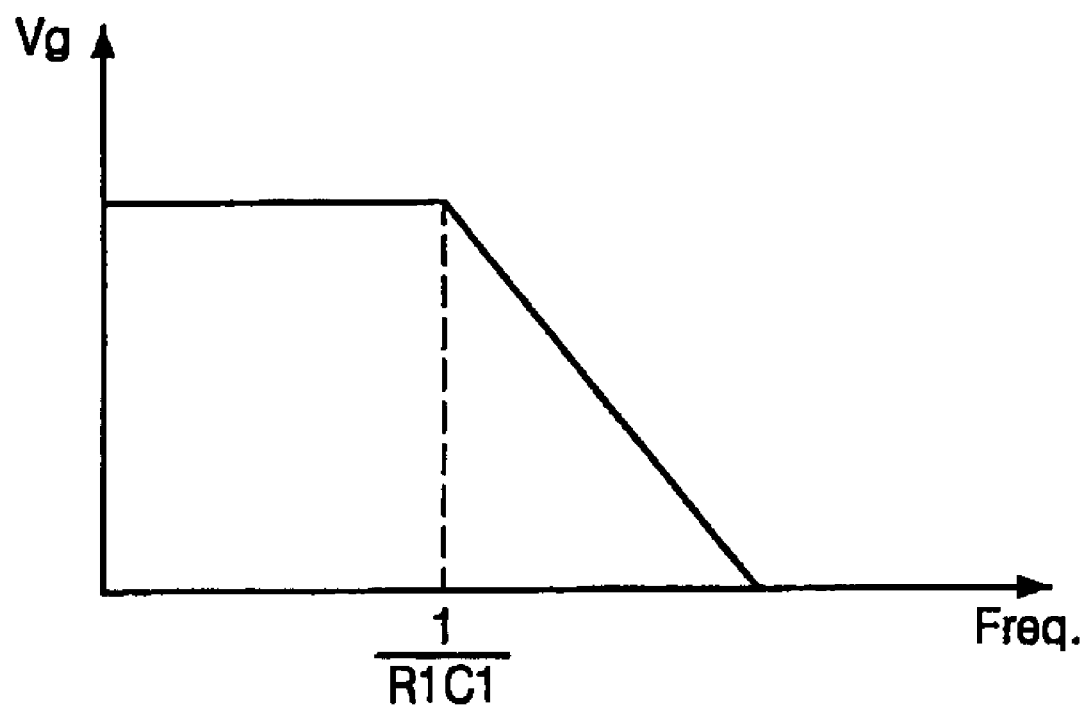
FIG. 1B is a graph illustrating the pass characteristics of the first-order low-pass filtering circuit illustrated in FIG. 1A.
Figure 2A:
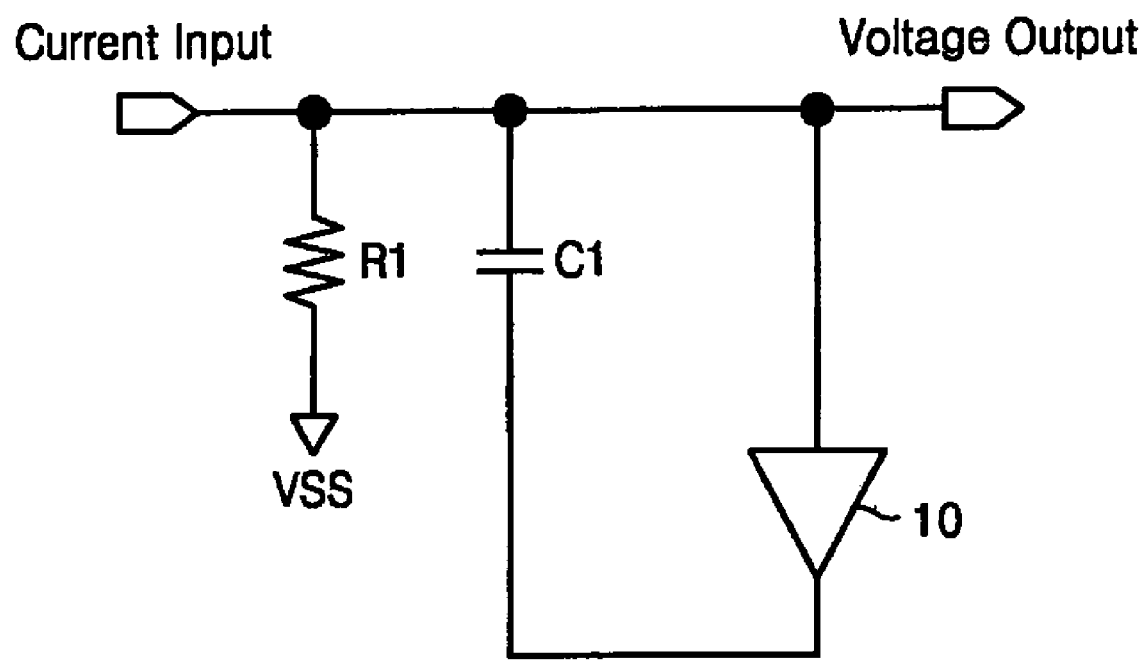
FIG. 2A illustrates a conventional low-pass filtering circuit including an amplifier.
Figure 2B:
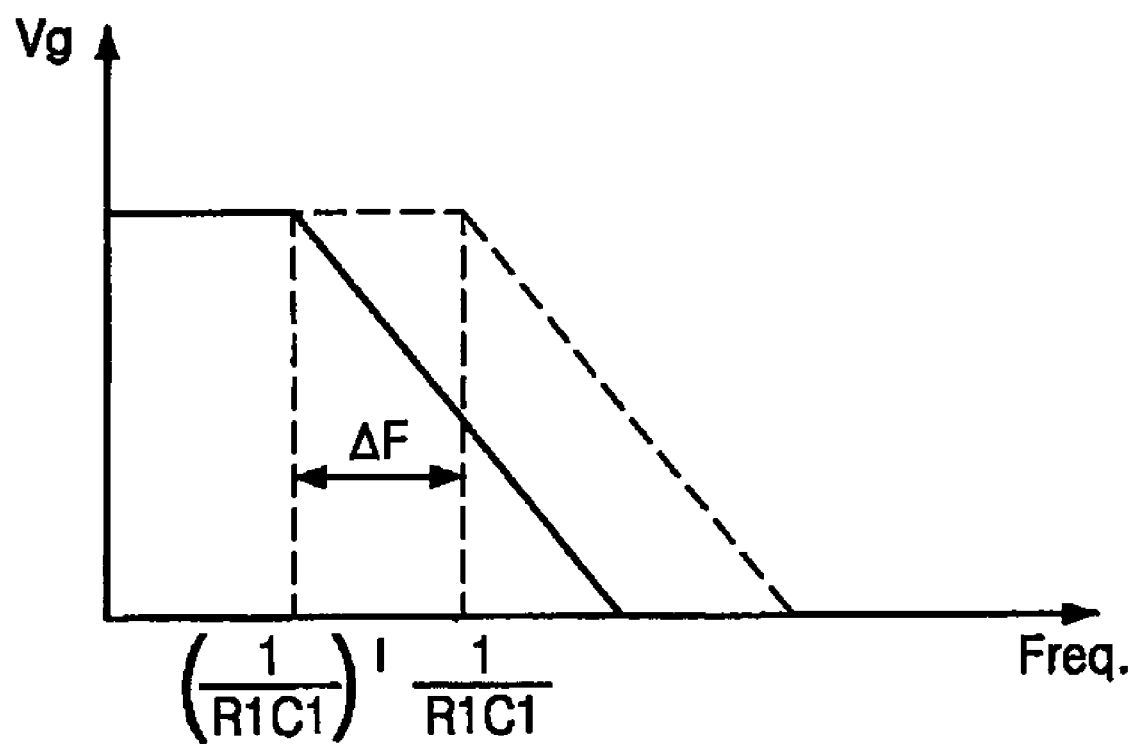
FIG. 2B is a graph illustrating the pass characteristics of the low-pass filtering circuit illustrated in FIG. 2A.
Figure 4:
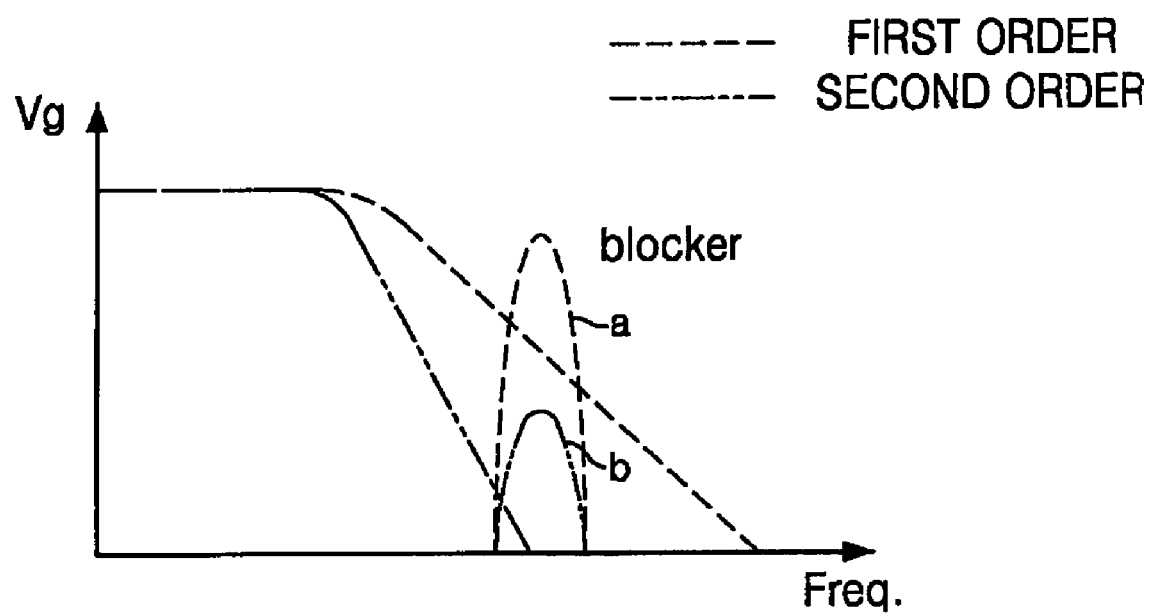
FIG. 4 is a graph comparing the pass characteristics of the high-order low-pass filtering circuit illustrated in FIG. 3 versus the pass characteristics of the first-order low-pass filtering circuit illustrated in FIG. 1A.

FIG. 4 is a graph comparing the pass characteristics of the high-order low-pass filtering circuit illustrated in FIG. 3 with the pass characteristics of the first-order low-pass filtering circuit illustrated in FIG. 1A. Referring to FIG. 4, a roll-off slope as measured by voltage gain Vg for the low-pass filtering circuit having the second-order low-pass characteristics is greater than the roll-off edge slope of a voltage gain Vg of the low-pass filtering circuit having the first-order low-pass characteristics. Accordingly, the second-order low-pass filtering circuit has better performance in removing a blocker signal than the first-order low-pass filtering circuit.

When the low-pass filtering circuit according embodiments of the invention is used in various types of applications and related circuits (e.g., load circuits having the second-order low-pass characteristics, trans-impedance amplifiers having the second-order low-pass characteristics, and receiving circuits used in communication systems), the characteristics of the application and related circuits are improved. For instance, when the low-pass filtering circuit according to embodiments of the invention is used in a receiving circuit (e.g., a direct conversion receiver (DCR) or a low intermediate frequency (LIF) receiver) of a communication system, blocker signals are significantly suppressed, and therefore, the linear characteristics of the receiving circuit can be improved.

As is shown in the graph illustrated in FIG. 4, the conventional first-order low-pass filtering circuit removes just a small amount of blocker signals, thereby leaving a relatively large blocker signal "a" while the high-order or second-order low-pass filtering circuit according to embodiments of the invention removes a relatively larger amount of block signals, thereby leaving only a small blocker signal "b".

FIG. 5A illustrates a conventional load circuit having second-order low-pass characteristics. Referring to FIG. 5A, the conventional load circuit having the second-order low-pass characteristics includes a first resistor R3 and a first capacitor C3 connected in parallel between a power supply node VDD and a first input terminal IN1, a second resistor R4 and a second capacitor C4 connected in parallel between the power supply node VDD and a second input terminal IN2, a first output terminal OUT1, and a second output terminal OUT2.

A high-frequency signal contained in a signal input to the first input terminal IN1 is removed by first resistor R3 and first capacitor C3, and then a high-frequency removed signal is output to the first output terminal OUT1. Meanwhile, a high-frequency signal contained in a signal input to the second input terminal IN2 is removed by second resistor R4 and second capacitor C4, and then a high-frequency removed signal is output to the second output terminal OUT2. A portion where first resistor R3 and first capacitor C3 are connected in parallel and a portion where second resistor R4 and second capacitor C4 are connected in parallel have low-pass characteristics.

Figure 5B:
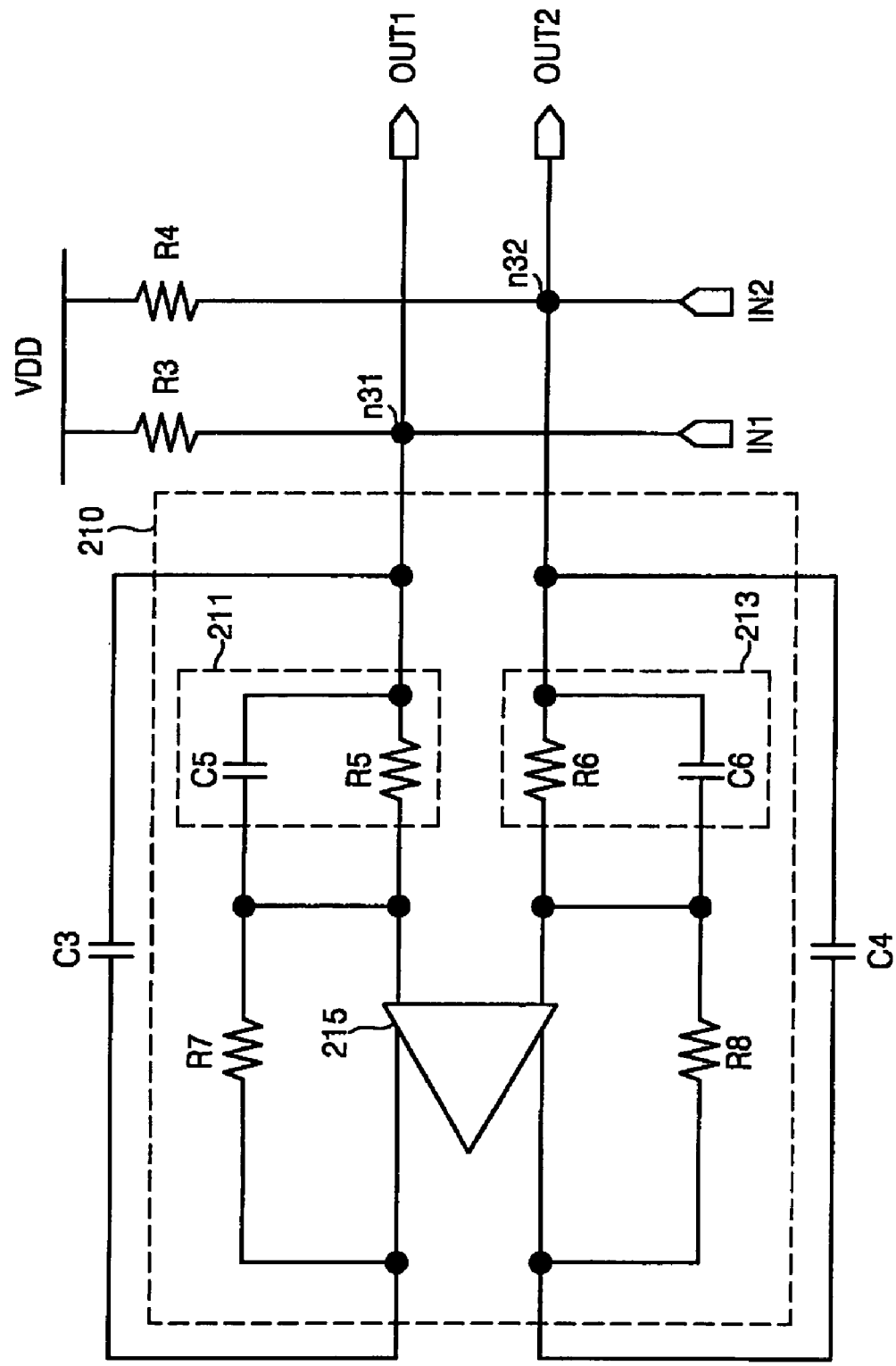
FIG. 5B illustrates a load circuit having second-order low-pass characteristics according to an embodiment of the invention.

FIG. 5B illustrates a load circuit having second-order low-pass characteristics according to an embodiment of the invention. As compared to the load circuit illustrated in FIG. 5A, the load circuit illustrated in FIG. 5B further comprises a capacitance multiplier 210. Capacitance multiplier 210 multiplies the capacitance of each one of capacitors C3 and C4, thereby improving the low-pass characteristics.

Referring to FIG. 5B, the load circuit having the second-order low-pass characteristics includes first resistor R3 connected between a first node n31 and the power supply node VDD, second resistor R4 connected between a second node n32 and the power supply node VDD, first capacitor C3 connected between the first node n31 and a first output terminal of differential amplifier 215, second capacitor C4 connected between the second node n32 and a second output terminal of differential amplifier 215, and capacitance multiplier 210.

In the illustrated embodiment, capacitance multiplier 210 multiplies the capacitance of first capacitor C3 and the capacitance of second capacitor C4 in response to a signal input via the first node n31 and a signal input via the second node n32.

Capacitance multiplier 210 includes a first high-pass filter 211, a second high-pass filter 213, and the differential amplifier 215. First high-pass filter 211 includes a third capacitor C5 and a third resistor R5 connected in parallel between the first node n31 and a first input terminal (e.g., one of two input terminals) of differential amplifier 215 and outputs only a high-frequency signal in a signal input via the first node n31 to the first input terminal of differential amplifier 215.

Second high-pass filter 213 includes a fourth capacitor C6 and a fourth resistor R6 connected in parallel between the second node n32 and a second input terminal (e.g., the other one of the two input terminals) of differential amplifier 215 and outputs only a high-frequency signal in a signal input via the second node n32 to the second input terminal of differential amplifier 215.

Capacitance multiplier 210 further includes a fifth resistor R7 connected between the first input terminal and the first output terminal of differential amplifier 215 and a sixth resistor R8 connected between the second input terminal and the second output terminal of differential amplifier 215.

Figure 6A:
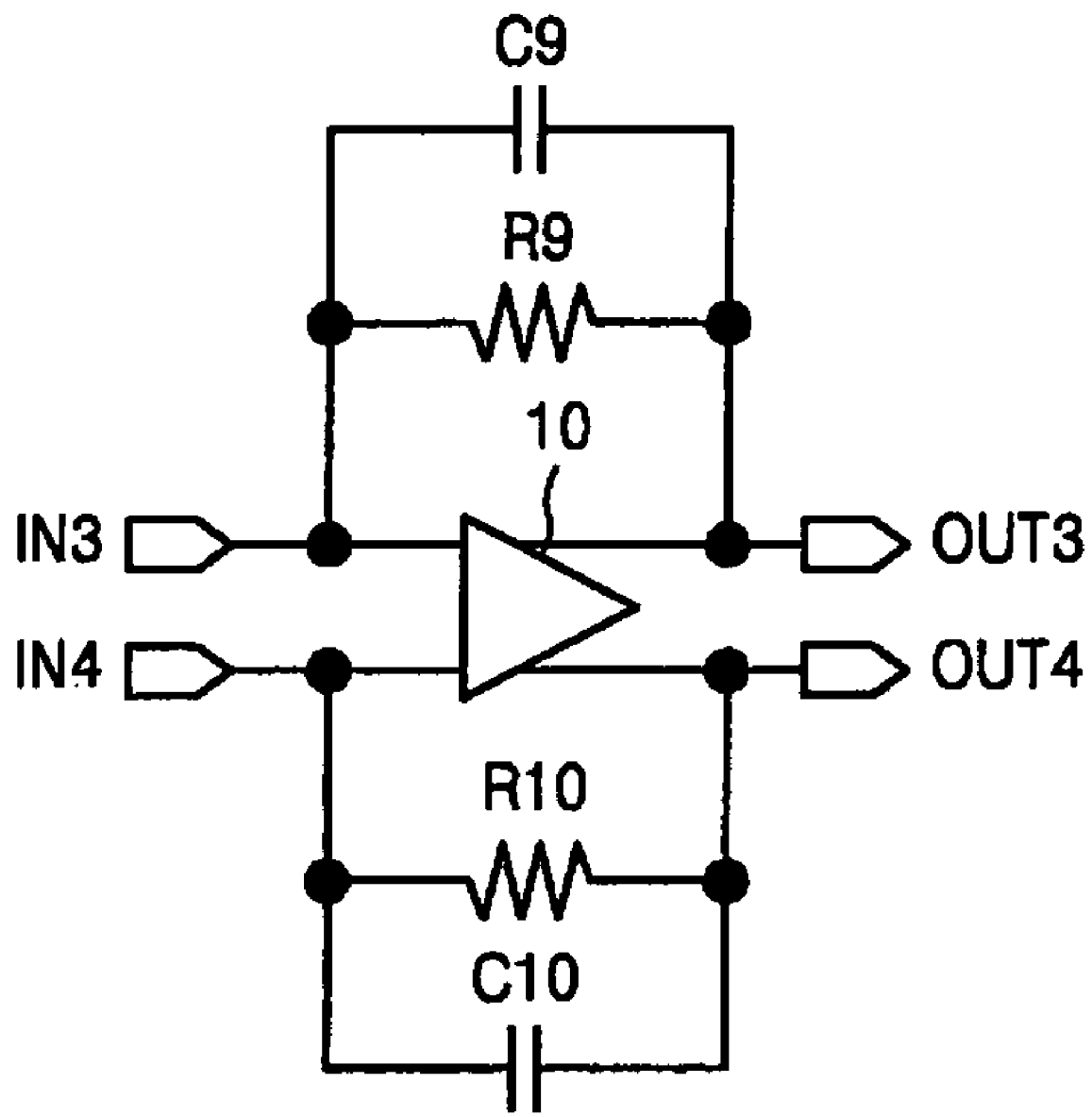
FIG. 6A is a conventional circuit diagram of a trans-impedance amplifier.
Figure 6B:
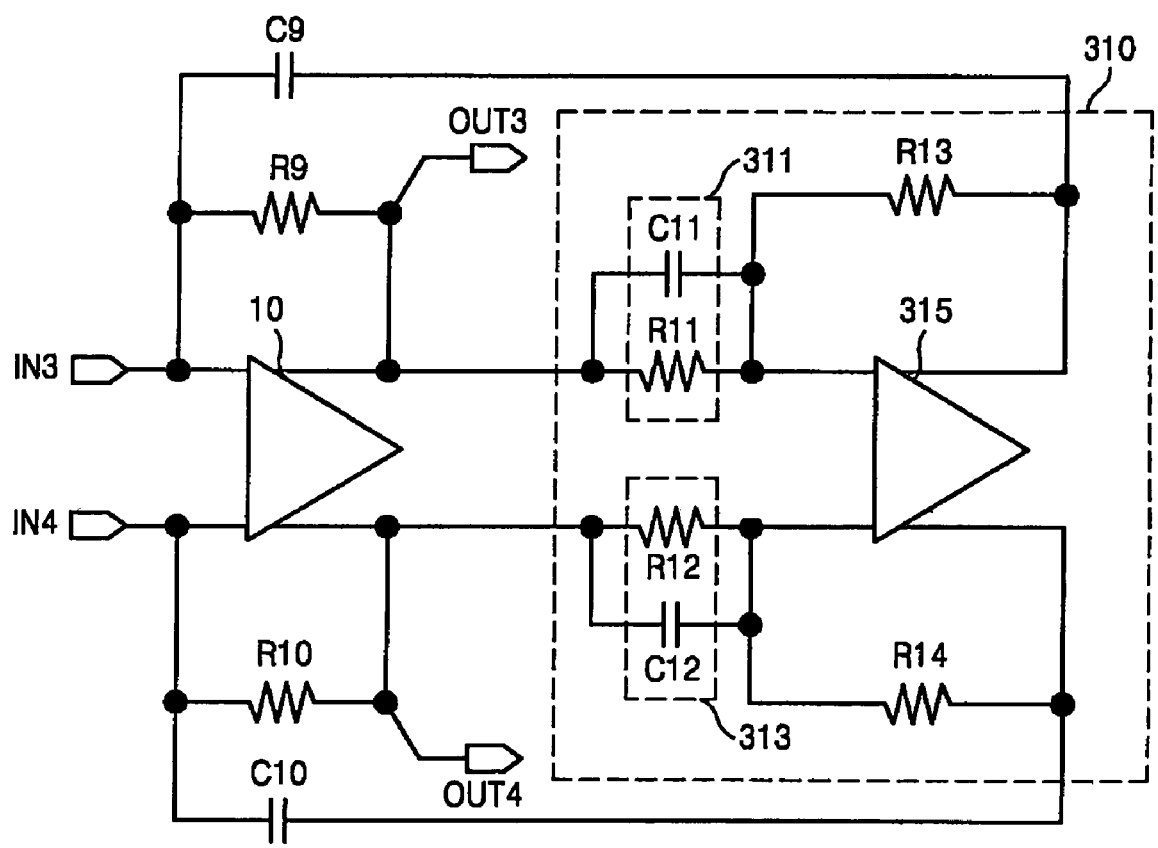
FIG. 6B is a circuit diagram of a trans-impedance amplifier circuit according to an embodiment of the invention.

FIG. 6A is a conventional circuit diagram of a trans-impedance amplifier. Referring to FIG. 6A, the conventional trans-impedance amplifier includes a first capacitor C9 and a first resistor R9 connected in parallel between a first input terminal IN3 and a first output terminal OUT3 of the differential amplifier 10 and a second capacitor C10 and second resistor R10 connected in parallel between a second input terminal IN4 and a second output terminal OUT4 of the differential amplifier 10.

In the conventional trans-impedance amplifier illustrated in FIG. 6A, a portion where the first resistor R9 and the first capacitor C9 are connected in parallel and a portion where the second resistor R10 and the second capacitor C10 are connected in parallel have the low-pass characteristics. When the portions are separately connected with a capacitance multiplier 310, a trans-impedance amplifier having improved low-pass characteristics can be implemented as illustrated in FIG. 6B.

FIG. 6B is a circuit diagram of a trans-impedance amplifier circuit according to an embodiment of the invention. Referring to FIG. 6B, the trans-impedance amplifier circuit comprises first differential amplifier 10, first resistor R9 connected between the first input terminal IN3 (e.g., one of the two input terminals) of first differential amplifier 10 and the first output terminal OUT3 (e.g., one of the two output terminals) of first differential amplifier 10, second resistor R10 connected between the second input terminal IN4 (e.g., the other one of the two input terminals) of first differential amplifier 10 and the second output terminal OUT4 (e.g., the other one of the two output terminals) of first differential amplifier 10, and capacitance multiplier 310 generating high-frequency signals to multiply the capacitance of the first capacitor C9 and the capacitance of the second capacitor C10 in response to output signals of first differential amplifier 10.

Capacitance multiplier 310 includes a first high-pass filter 311, a second high-pass filter 313, and a second differential amplifier 315.

First high-pass filter 311 includes a third capacitor C11 and a third resistor R11 connected in parallel between the first output terminal OUT3 of the first differential amplifier 10 and a first input terminal (e.g., one of two input terminals) of second differential amplifier 315 and outputs only a high-frequency signal in a signal output from the first output terminal OUT3 to the first input terminal of second differential amplifier 315.

Second high-pass filter 313 includes a fourth capacitor C12 and a fourth resistor R12 connected in parallel between the second output terminal OUT4 of first differential amplifier 10 and a second input terminal (e.g., the other one of the two input terminals) of second differential amplifier 315 and outputs only a high-frequency signal in a signal output from the second output terminal OUT4 to the second input terminal of second differential amplifier 315.

A high-frequency signal output from a first output terminal of second differential amplifier 315 is input to the first capacitor C9 to multiply the capacitance of the first capacitor C9 and a high-frequency signal output from a second output terminal of second differential amplifier 315 is input to the second capacitor C10 to multiply the capacitance of the second capacitor C10.

In the illustrated embodiment, capacitance multiplier 310 further comprises a fifth resistor R13 connected between the first input terminal and the first output terminal of second differential amplifier 315 and a sixth resistor R14 connected between the second input terminal and the second output terminal of second differential amplifier 315.

FIG. 7 is a circuit diagram of a direct conversion receiver comprising a low-pass filtering circuit according to an embodiment of the invention. Referring to FIG. 7, the direct conversion receiver comprises a low noise amplifier 410 amplifying a received signal, a first mixer 420, a first low-pass filtering circuit 440, a second mixer 450, and a second low-pass filtering circuit 460.

First mixer 420 mixes an output signal provided by low noise amplifier 410 with an output signal of a phase shifter, thereby generating a quadrature phase signal Q. The phase shifter generates the output signal which has a 90° phase difference with a local oscillation signal cos ωLot generated by a local oscillator.

First low-pass filtering circuit 440 removes a blocker signal from a signal output from first mixer 420 using a high-frequency signal contained in the output signal of first mixer 420 and generates a blocker-removed quadrature phase signal Q.

Second mixer 450 mixes the output signal of low noise amplifier 410 with the local oscillation signal cos ωLot, thereby generating an in-phase signal I.

Second low-pass filtering circuit 460 removes a blocker signal from a signal output from second mixer 450 using a high-frequency signal contained in the output signal of second mixer 450 and generates a blocker-removed in-phase signal I.

First low-pass filtering circuit 440 includes a resistor R51, a capacitor C51, a high-pass filter 441, and a buffer 443. Buffer 443 buffers a high-frequency signal output from high-pass filter 441 and feeds the buffered high-frequency signal back to capacitor C51 to multiply the capacitance of capacitor C51.

Second low-pass filtering circuit 460 includes a resistor R52, a capacitor C52, a high-pass filter 461, and a buffer 463. Buffer 463 buffers a high-frequency signal output from high-pass filter 461 and feeds the buffered high-frequency signal back to capacitor C52 to multiply the capacitance of capacitor C52. Buffers 443 and 463 may be implemented by amplifiers.

As described above, a low-pass filtering circuit according to an embodiment of the invention feeds-back a signal output from a high-pass filter, thereby improving its pass characteristics and improving the low-pass characteristics of application circuits using the low-pass filtering. In other words, a high-pass filter is used on a feedback loop for capacitance multiplication, and therefore, a higher capacitance multiplication rate can be obtained at a high frequency than at a low frequency. As a result, a high-order low-pass filtering circuit can be implemented. Here, when an N-th order high-pass filter is used, a high-order filter can be used without increasing noise. For instance, when an n-order high-pass filter is used in a first order low-pass filter using an RC circuit, a low-pass filtering circuit having (N+1)-th order low-pass characteristics can be manifested. In addition, various kinds of application circuits (e.g., load circuits having second-order low-pass characteristics, trans-impedance amplifiers having the second-order low-pass characteristics, and receiving circuits used in communication systems) having improved low-pass characteristics can be manifested by using a low-pass filtering circuit consistent with an embodiment of the invention.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A low-pass filtering circuit comprising:
   a low-pass filter comprising a capacitor and configured to generate an output signal; and
   a multiplier configured to multiply capacitance of the capacitor, wherein the multiplier comprises:
   an N-th order high-pass filter configured to pass a high-frequency component of the output signal, and
   an amplifier configured to amplify the high-frequency component to generate an amplified signal, and apply the amplified signal to the capacitor as a feedback signal.

2. The low-pass filtering circuit of claim 1, wherein the low-pass filter is a resistor-capacitor (RC) low-pass filter.

3. The low-pass filtering circuit of claim 1, wherein the low-pass filter is an inductor-capacitor (LC) low-pass filter.

4. The low-pass filtering circuit of claim 1, wherein the low-pass filter receives an output signal provided by a mixer of a wireless receiver as an input.

5. A low-pass filtering method comprising:
   low pass filtering a low frequency signal using a capacitor to generate an output signal;
   high-pass filtering a high frequency component of the output signal using a N-th order high pass filter; and
   amplifying the high frequency component passed by from the N-th order high-pass filter to generate an amplified signal, and applying the amplified signal to the capacitor as a feedback signal to multiply capacitance of the capacitor.

6. The low-pass filtering method of claim 5, wherein low-pass filtering of the low frequency signal is performed using a resistor-capacitor (RC) low-pass filter or an inductor-capacitor (LC) low-pass filter.

7. The low-pass filtering method of claim 5, wherein low-pass filtering of the low frequency signal is performed in response to an output signal provided by a mixer of a wireless receiver.

* * * * *